United States Patent [19]

Yoshioka et al.

[11] Patent Number: 5,677,000
[45] Date of Patent: Oct. 14, 1997

[54] SUBSTRATE SPIN TREATING METHOD AND APPARATUS

[75] Inventors: Katsushi Yoshioka; Yoshiteru Fukutomi; Tsuyoshi Mitsuhashi; Kenji Sugimoto, all of Kyoto, Japan

[73] Assignee: Dainippon Screen Mfg. Co., Ltd., Japan

[21] Appl. No.: 699,728

[22] Filed: Aug. 19, 1996

[30] Foreign Application Priority Data

Aug. 24, 1995 [JP] Japan .................. 7-240721
May 16, 1996 [JP] Japan .................. 8-148316

[51] Int. Cl.$^6$ .................. B05D 3/12; B05C 11/00
[52] U.S. Cl. .................. 427/240; 118/32; 427/385.5
[58] Field of Search .................. 427/240, 385.5; 118/52

[56] References Cited

U.S. PATENT DOCUMENTS

| 4,518,678 | 5/1985 | Allen | 427/240 |
| 4,674,521 | 6/1987 | Paulfus | 148/52 |
| 5,234,499 | 8/1993 | Sasaki et al. | 427/240 |
| 5,312,487 | 5/1994 | Akimoto et al. | 118/52 |

Primary Examiner—Janyce Bell
Attorney, Agent, or Firm—Ostrolenk, Faber, Gerb & Soffen, LLP

[57] ABSTRACT

A substrate spin treating method and apparatus having a cup cleaner device for cleaning a scatter preventive cup, which cleaner device does not require attaching and/or detaching of a cleaning jig. The cleaner device is driven through engagement with a spin chuck which operates at a low torque that is provided for normal substrate spin treating operation. During the normal spin treating operation, only the spin chuck is driven by a rotary shaft, with the cup cleaner device being disengaged from the spin chuck and its driving rotary shaft. For a cup cleaning operation, the spin chuck and scatter preventive cup are vertically moved relative to each other to place the cup cleaner device at a cup cleaning height and to drivingly connect the cup cleaner device to the rotary shaft through a torque transmitter. In this state, the cup cleaner device is rotated to establish a centrifugal force that scatters a cleaning solution supplied to a cleaning solution guide of the cup cleaner device from cleaning solution supply nozzles, thereby cleaning inner surfaces of the scatter preventive cup.

15 Claims, 7 Drawing Sheets

SUBSTRATE SPIN TREATING METHOD AND APPARATUS

BACKGROUND OF THE INVENTION

(1) Field of the Invention

This invention relates to methods and apparatus for applying a treating solution, e.g. photoresist, photosensitive polyimide, a photosensitive resin to act as a color filter, a glass solvent, or dopant, uniformly over surfaces of substrates, such as semiconductor wafers, glass substrates for liquid crystal displays, glass substrates for photomasks, substrates for optical disks or the like, while said substrates are being supported by a spin chuck or other substrate supporting device and spun at high speed about a vertical axis. More particularly, the invention relates to a technique of cleaning inner surfaces of a scatter preventive cup surrounding the substrate supporting device.

(2) Description of the Related Art

Conventionally, this type of substrate spin treating apparatus includes a scatter preventive cup surrounding the substrate supporting device such as a spin chuck. A treating solution applied to spinning substrates and scattering from the substrates is received and collected by the scatter preventive cup. Part of the treating solution scattering from the spinning substrates may adhere to and dry hard on inner surfaces of the scatter preventive cup. This results in substantial variations in the inner configuration of the scatter preventive cup and such variations affect coating performance. Further, the solidified treating solution may be reduced to fine particles of dust by vibration or the like occurring during spins of the substrates. Such particles of dust may float about in a treating chamber, and adhere to and contaminate the surfaces of the substrates under treatment. In order to avoid such inconvenience, periodically it is preferable to wash the treating solution from the inner surfaces of the scatter preventive cup. The following cleaning devices have been proposed and implemented heretofore:

(1) A first example of conventional cleaning apparatus includes a liquid supply pipe extending around a scatter preventive cup for circulating a cleaning solution. The liquid supply pipe has a plurality of conduits branching therefrom and opening to inner surfaces of the scatter preventive cup. The cleaning solution is delivered through these openings to flow down the inner surfaces of the scatter preventive cup, thereby cleaning the inner surfaces.

(2) A second example of conventional cleaning apparatus includes a cleaning jig attachable to a spin chuck for cleaning a scatter preventive cup. The jig is detached from the spin chuck during a normal spin coating operation. Specifically, the cleaning jig is approximately in disk form, and defines an inner or lower space to which a cleaning solution is supplied. The inner or lower space communicates with a plurality of discharge openings defined peripherally of the cleaning jig. The cleaning solution is supplied through a nozzle into the inner or lower space while the cleaning jig is spun on the spin chuck. The cleaning solution is jetted out by centrifugal force through the discharge openings defined peripherally of the cleaning jig to clean the scatter preventive cup.

(3) A third example of conventional cleaning apparatus includes a spin chuck having a cleaning solution guide. A cleaning solution supplied from an external source is jetted out by centrifugal force through the cleaning solution guide to the ambient, to thereby clean inner surfaces of a scatter preventive cup.

The conventional examples noted above have the following disadvantages.

In the example (1) above, the cleaning solution is delivered through the openings in the inner surfaces of the scatter preventive cup to flow down and clean the inner surfaces. This construction lacks sufficient mechanical cleaning power to jet out the cleaning solution and clean the inner surfaces of the cup. Its cleaning capability is relatively low, and large quantities of the cleaning solution are required to produce a sufficient cleaning effect.

The example (2) has an increased cleaning capability since the cleaning solution is jetted out by centrifugal force toward the inner surfaces of the cup to add a mechanical cleaning power to the dissolving action of the cleaning solution. However, the cleaning jig must be attached to the spin chuck each time a cleaning operation is carried out, and after each cleaning operation the jig must detached from the chuck and stored. Thus, time-consuming steps must be taken before and after each cleaning operation. Another drawback is that additional space is required for storage of the cleaning jig. Further, surfaces of the spin chuck tend to be marred by the cleaning jig attached thereto, which could in turn contaminate back side surfaces of the substrates placed on the spin chuck.

The example (3) is free from the drawbacks of examples (1) and (2) and exhibits a high cleaning capability since the spin chuck has the cleaning solution guide. However, the spin chuck must have a large diameter to place the cleaning solution guide close to the inner surfaces of the cup. The large spin chuck requires a strong driving torque, giving rise to a different drawback of having to increase output of a spin chuck drive mechanism. In particular, the spin chuck is spun at high speed during a normal spin coating operation an it is difficult to control the rotational speed of a large spin chuck.

SUMMARY OF THE INVENTION

This invention has been made having regard to the state of the art noted above, and its object is to provide a substrate spin treating method and apparatus having superior ability for cleaning a scatter preventive cup, without requiring attaching and detaching operations for a cleaning jig and without requiring a special space for storing a jig, and yet capable of suitably driving a substrate supporting device with a low torque during a normal substrate spin treating operation.

The above object is fulfilled, according to one aspect of this invention, by a substrate spin treating method for treating a surface of a substrate with a treating solution while spinning the substrate, the treating solution scattering from the spinning substrate being received and collected by a scatter preventive cup, the method comprising:

a spin-treating step for treating the surface of the substrate in a first position established by moving a substrate supporting device and a cup cleaner relative to each other, the substrate supporting device having a rotary shaft extending through the cup cleaner to be vertically movable relative thereto, the cup cleaner defining a cleaning solution guide for guiding a cleaning solution to peripheral positions of the guide, the rotary shaft and the cup cleaner being disengaged from each other and only the substrate supporting device being spun in the first position; and a cup cleaning step for cleaning inner surfaces of the scatter preventive cup in a second position established by vertically moving the substrate supporting device and the cup cleaner relative to each other, the rotary shaft and the cup cleaner being engaged with each other in the second position, the cleaning solution being supplied to the cup cleaner while the substrate supporting device and the cup cleaner spin together, the cleaning solution jetting out of the peripheral positions of the cup cleaner under centrifugal force to clean the inner surfaces of the scatter preventive cup.

In the method according to this invention, the cup cleaner is moved vertically along and relative to the rotary shaft of the substrate supporting device. The cup cleaner is disconnected from the rotary shaft for a substrate spin treating operation, and is connected to the rotary shaft for a cup cleaning operation. Thus, it is unnecessary to attach and detach the cup cleaner. During the spin treating operation, only the substrate supporting device is driven with a low torque. During the cup treating operation, the centrifugal force of the cup cleaner is utilized to jet out the cleaning solution for cleaning the inner surfaces of the scatter preventive cup. This feature assures an excellent cleaning effect.

In the above method, for example, the first position for the spin-treating step is where the substrate supporting device and the cup cleaner lie close to each other after a vertical relative movement, and the second position for the cup cleaning step is where the substrate supporting device and the cup cleaner are seperated from each other after a vertical relative movement. Further, substrates may be transported to and from the substrate supporting device in a third position intermediate the first position and the second position.

In another aspect of the invention, there is provided a substrate spin treating apparatus for treating a surface of a substrate with a treating solution while spinning the substrate, comprising:

- a substrate supporting device for supporting the substrate;
- a rotating device for rotating the substrate supporting device about a vertical axis through a rotary shaft;
- a treating solution supplying device for supplying the treating solution to the substrate;
- a scatter preventive cup surrounding the substrate supporting device for preventing the treating solution from scattering from the substrate when the substrate is spun;
- a cleaning solution supplying device for supplying a cleaning solution;
- a cup cleaner fitted on the rotary shaft and defining a cleaning solution guide for guiding the cleaning solution supplied from the cleaning solution supplying device to peripheral positions of the cup cleaner;
- a lift device for moving the cup cleaner and the scatter preventive cup vertically relative to the substrate supporting device such that, during spin treatment of the substrate, the substrate supporting device and the cup cleaner lie close to each other, with the scatter preventive cup surrounding the substrate supporting device, and during cleaning of the scatter preventive cup, the substrate supporting device and the cup cleaner are remote from each other, with inner surfaces of the scatter preventive cup opposed to the peripheral positions of the cup cleaner; and
- an engaging device for disconnecting the cup cleaner from the rotary shaft when the substrate supporting device and the cup cleaner lie close to each other, and connecting the cup cleaner to the rotary shaft when the substrate supporting device and the cup cleaner are remote from each other.

For a normal spin treating operation, the lift device moves the substrate supporting device and cup cleaner close to each other, thereby disengaging the cup cleaner from the rotary shaft of the substrate supporting device. As a result, only the substrate supporting device is driven by the rotating device to spread the treating solution over the spinning substrate. Part of the treating solution scattering from the spinning substrate is received and collected by the scatter preventive cup having been moved by the lift device to the position surrounding the substrate supporting device.

For cleaning the scatter preventive cup, the lift device moves the substrate supporting device and cup cleaner away from each other, thereby connecting the cup cleaner to the rotary shaft through the engaging device. The peripheral positions of the cup cleaner are now opposed to the inner surfaces of the scatter preventive cup. Consequently, torque of the rotating device is transmitted through the rotary shaft to the cup cleaner to rotate the cup cleaner. In this state, the centrifugal force of the cup cleaner is applied to the cleaning solution supplied from the cleaning solution supplying device to the cup cleaner. The cleaning solution is then guided by the cleaning solution guide to jet out of the peripheral positions of the cup cleaner, thereby effectively cleaning the inner surfaces of the scatter preventive cup.

With the apparatus according to this invention, the dissolving action of the cleaning solution is combined with mechanical cleaning power of the cleaning solution jetting out under centrifugal force, to achieve high performance cleaning. The cup cleaner need not be attached or detached for each cup cleaning operation, thereby realizing reduced cup cleaning time. This apparatus requires no effect or space for storing the cup cleaner, which is an advantage in handling convenience and equipment control. During the normal spin treating operation, the cup cleaner is disengaged from the rotary shaft, so that only the substrate supporting device is driven with a low torque. This diminishes the load of the rotating device, and facilitates control of the rotating rate. Further, since the cup cleaner is not mounted on a substrate supporting surface of the substrate supporting device, the substrate is never contaminated via the substrate supporting device.

The device for supplying the cleaning solution to the cup cleaner is not limited to a particular construction. For example, the cleaning solution supplying device is disposed below the cup cleaner, the cup cleaner being disk-shaped and defining the cleaning solution guide peripherally of a lower surface thereof.

The cleaning solution guide includes an annular slant surface inclined upward outwardly of the cup cleaner, for example. In this case, a plurality of cleaning solution discharge openings are formed peripherally of the cup cleaner for jetting out the cleaning solution guided by the annular slant surface. The cleaning solution supplied from the cleaning solution supplying device is pushed up along the annular slant surface by the centrifugal force of the cup cleaner, to jet out of the cleaning solution discharge openings.

Preferably, the cleaning solution guide further includes an annular recess opening toward a spin center. In this case, the cleaning solution supplied from the cleaning solution supplying device is stored in the annular recess. The cleaning solution stored in the annular recess is pushed up along the annular slant surface by the centrifugal force of the cup cleaner, to jet out of the cleaning solution discharge openings.

Preferably, the cleaning solution discharge openings have varied vertical directions and are distributed circumferentially of the cup cleaner. This construction causes the cleaning solution to jet out over a large vertical range for cleaning the inner surfaces of the scatter preventive cup evenly.

The apparatus according to this invention may further comprise a back side surface cleaning solution supplying device for supplying the cleaning solution toward a back side surface of the substrate. Preferably, the cup cleaner is formed of a synthetic resin since when the back side surface of the substrate is cleaned, part of the cleaning solution falls and evaporates on the cup cleaner. If the cup cleaner were formed of a metal having low specific heat or high heat conductivity, the cup cleaner would unde-rgo a marked temperature drop. As a result, a temperature drop could occur with the substrate disposed adjacent the cup cleaner, causing variations in the coating thickness of the treating solution thereon. Such a temperature drop is minimized where the cup cleaner is formed of a synthetic resin having high specific heat or low heat conductivity. Consequently, a temperature drop of the substrate lying adjacent the cup cleaner is suppressed to allow the substrate to be coated uniformly with the treating solution.

Preferably, the cup cleaner includes a flange extending from a position above the cleaning solution guide toward the scatter preventive cup. The flange reduces a gap between the scatter preventive cup and cup cleaner while the cup is being cleaned. The reduced gap suppresses leakage of the cleaning solution therethrough, with the flange preventing upward scattering of the cleaning solution jetting from the cleaning solution guide toward the scatter preventive cup. Thus, an improved directional control is provided for the jets of the cleaning solution, to prevent the cleaning solution from scattering outside the scatter preventive cup.

The apparatus according to this invention may further comprise a baffle disk disposed in a bottom region of the scatter preventive cup to be opposed to the back side surface of the substrate supported by the substrate supporting device, to achieve uniform gas flow at the substrate's periphery during substrate treatment. Preferably, the flange rests on an upper position of the baffle disk during the substrate treatment for obtaining the uniform gas flow in cooperation with the baffle disk. That is, during the substrate spin treatment, the baffle disk opposed to the back side surface of the substrate evenly distributed gas flow at the substrate's periphery. This uniforming function is impaired if the flange of the cup cleaner has an increased size to diminish the gap between the scatter preventive cup and cup cleaner. With the flange of the cup cleaner acting also as an upper portion of the baffle disk, the cleaning solution is prevented from scattering outside the scatter preventive cup, without impairing the flow uniforming function during the spin treatment.

The lift device is operable to move the scatter preventive cup vertically. For the spin treatment of the substrate, the lift device raises the scatter preventive cup to an uppermost position, with a base connected to the scatter preventive cup raising the cup cleaner close to the substrate supporting device. For the cleaning of the scatter preventive cup, the scatter preventive cup is lowered to a lowermost position, with the cup cleaner received by the engaging device and connected to the rotary shaft.

Further, when transporting substrates to and from the substrate supporting device, the lift device may be operable to move the scatter preventive cup to an intermediate position between the uppermost position and the lowermost position. The lift device may comprise a combination of upper and lower air cylinders for moving the scatter preventive cup vertically in three stages, as noted above.

The engaging device may, for example, include a torque transmitter protruding from the rotary shaft, whereby the cup cleaner moves away from the torque transmitter to be disengaged from the rotary shaft when the cup cleaner is raised along and relative to the rotary shaft. The cup cleaner fits with the torque transmitter to be engaged with the rotary shaft when the cup cleaner is lowered along and relative to the rotary shaft.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENTS

Figure 1:
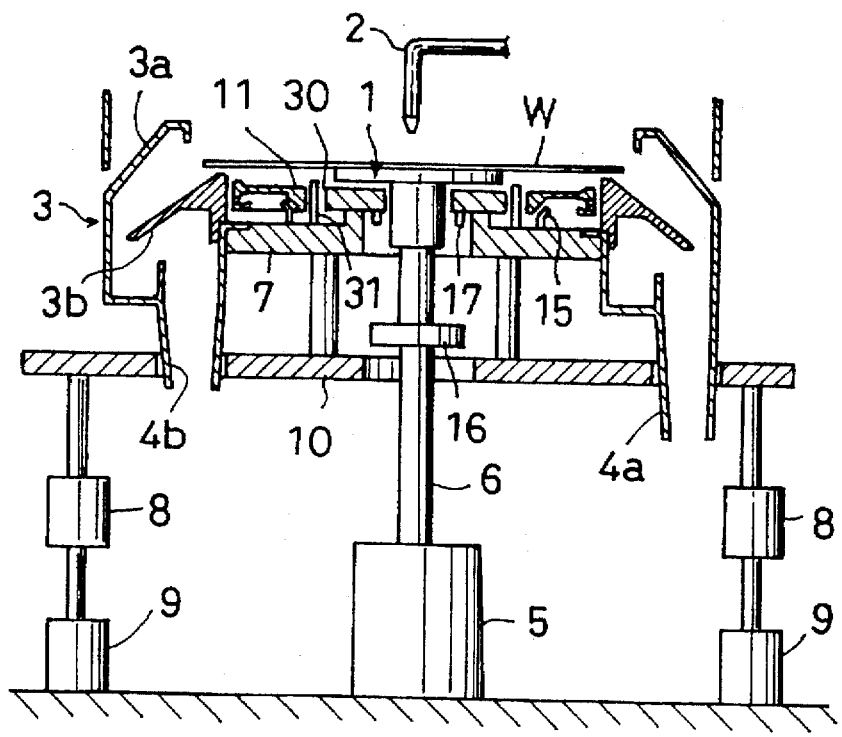
FIG. 1 is a vertical section of a substrate spin treating apparatus according to this invention, showing a spin coating process.
Figure 2:
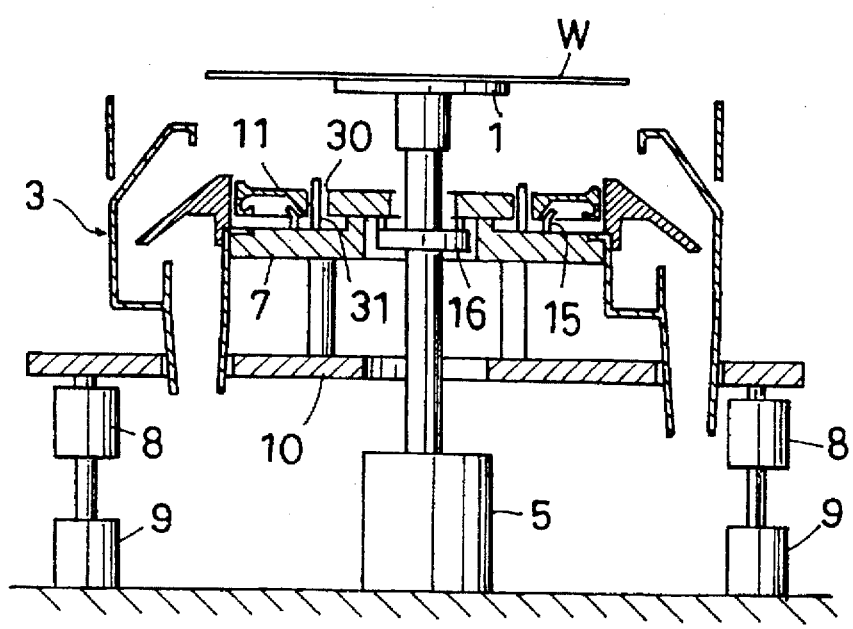
FIG. 2 is a vertical section of the apparatus, showing a substrate changing process.
Figure 3:
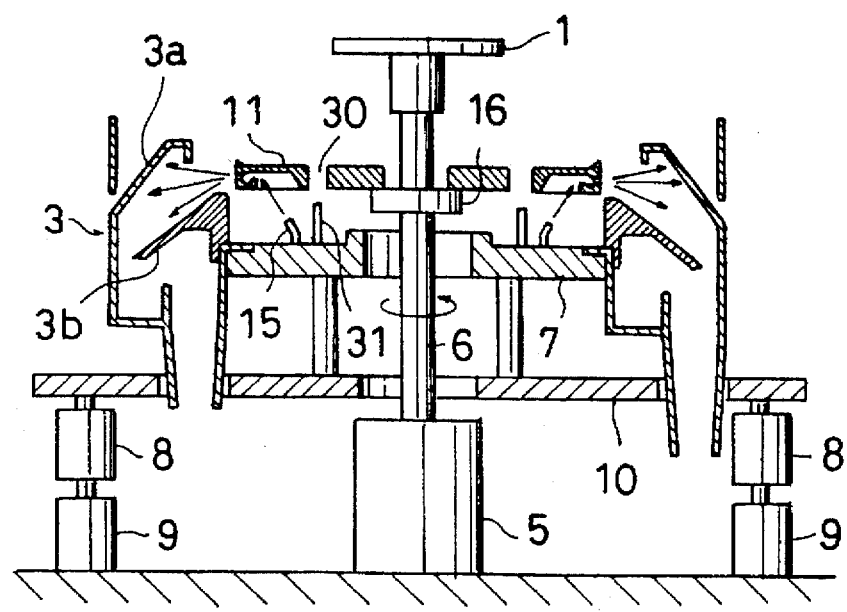
FIG. 3 is a vertical section of the apparatus, showing a cup cleaning process.
Figure 4:
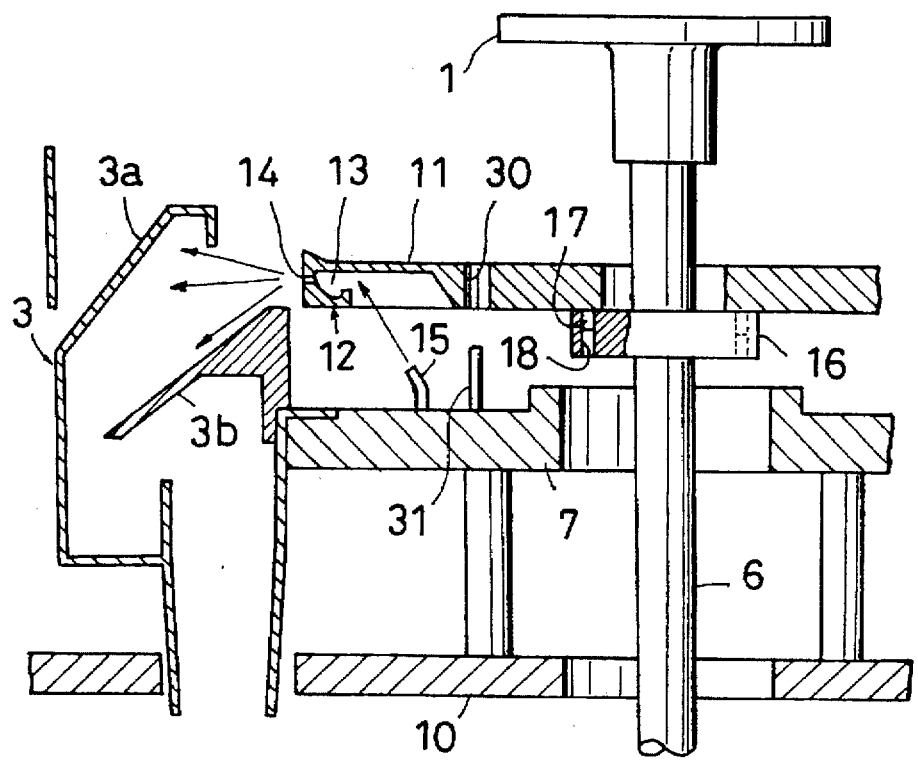
FIG. 4 is an enlarged fragmentary vertical section of the apparatus, showing the cup cleaning process.
Figure 5:
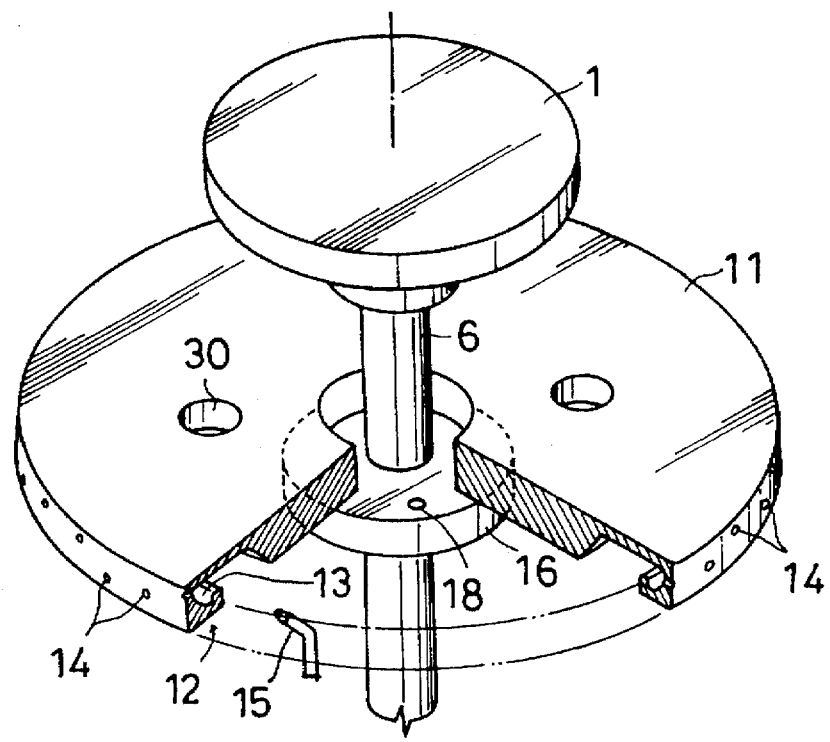
FIG. 5 is a perspective, partly in section, of a cup cleaner.
Figure 6:
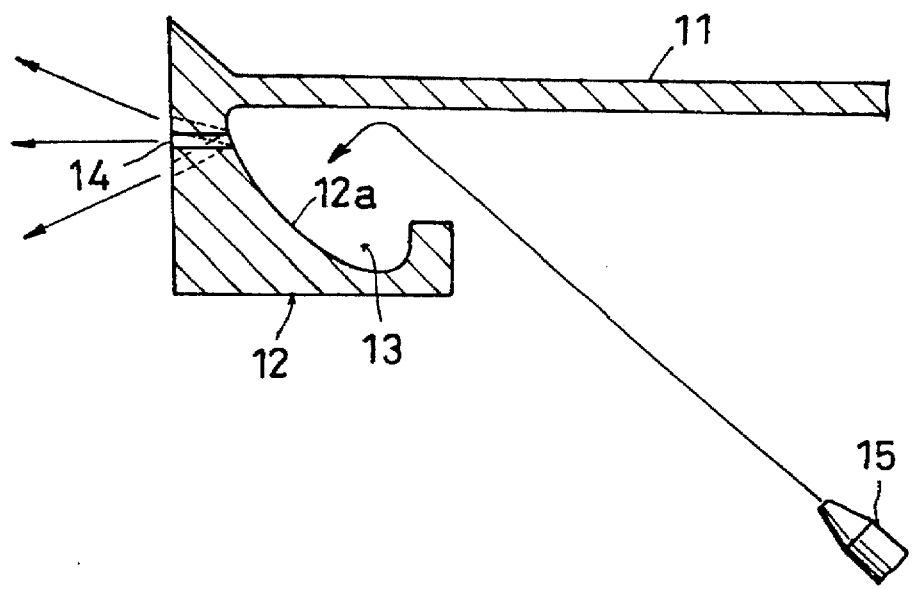
FIG. 6 is an enlarged fragmentary vertical section of the cup cleaner.

A preferred embodiment of this invention will be described in detail hereinafter with reference to the drawings and particularly to the vertical sections of FIGS. 1, through 3 that illustrates an outline of a substrate spin treating apparatus according to this invention. FIG. 1 illustrates a spin coating process, FIG. 2 illustrates a substrate changing process, and FIG. 3 illustrates a cup cleaning process. FIG. 4 is an enlarged fragmentary view in vertical section of the apparatus, showing the cup cleaning process. FIG. 5 is a perspective view, partly in section, of a cup cleaner. FIG. 6 is an enlarged fragmentary view in vertical section of the cup cleaner.

As shown in FIGS. 1 through 3, a spin treating apparatus includes a spin chuck 1 acting as a substrate supporting device for suction-supporting a substrate or wafer W and spinning it in a horizontal plane about a vertical axis. A nozzle 2 is disposed above the spin chuck 1 to act as a treating solution supplying device for supplying a treating solution such as photoresist or other selected coating material to a surface of wafer W. The spin chuck 1 and wafer W are surrounded by a scatter preventive cup 3. The scatter preventive cup 3 includes a waste solution collecting drain 4a disposed in a lower portion thereof for draining a superfluous part of the treating solution, and an exhaust port 4b for exhausting gases from the cup 3. The waste solution collecting drain 4a and exhaust port 4b are connected, respectively, to a waste solution pipe and an exhaust duct not shown.

The spin chuck 1 is disk-shaped and has a smaller diameter than wafer W. The spin chuck 1 is fixed to an upper end of a vertical rotary shaft 6 of a motor 5. The motor 5 corresponds to the rotating device of this invention.

The scatter preventive cup 3 is mounted on a base 7, and has a double tube structure including an outer cup 3a and a baffle disk 3b disposed in a bottom region of the outer cup 3a and opposed to wafer W. The baffle disk 3b is substantially circular in plan view, and defines a downward slant surface for guiding downward air flows entering the scatter preventive cup 3 to flow uniformly over an entire circumference of wafer W and down to the exhaust port 4b. The base 7 includes back rinse nozzles 31 arranged thereon to act as a back side surface cleaning solution supplying device for spraying a cleaning solution to the back side surface of wafer W. The base 7 is mounted on a lift plate 10 supported by upper and lower cylinders 8 and 9. These cylinders 8 and 9 are extendible and contractible for vertically moving the scatter preventive cup 3 in three stages. These cylinders 8 and 9 correspond to the lift device of this invention.

As shown in FIGS. 4 through 6, a cup cleaner 11 having a larger diameter than the spin chuck 1 is loosely fitted on the rotary shaft 6 connected to the spin chuck 1. The cup cleaner 11 is substantially circular, and preferably is formed of a synthetic resin such as PEEK (polyether ether ketone), PP (polypropylene), PE (polyethylene) or PVDF (polyvinyl difluoride). The cup cleaner 11 defines bores 30 through which the back rinse nozzles 31 extend when the base 7 of the scatter preventive cup 3 is raised as described hereinafter. The cup cleaner 11 further defines a cleaning solution guide 12 peripherally of a lower surface thereof. The cleaning solution guide 12 includes an annular slant surface 12a inclined outwardly upward. The cleaning solution guide 12 also includes an annular recess 13 opening toward a spin center, and a plurality of cleaning solution discharge openings 14 communicating with the recess 13. As shown in FIGS. 5 and 6, the discharge openings 14 are distributed circumferentially, some of which are directed slightly upward, others directed horizontally, and the third type directed slightly downward, to supply the cleaning solution efficiently over a wide range.

As shown in FIGS. 1 and 2, the cup cleaner 11 is supported by the base 7 of the scatter preventive cup 3 when the base 7 is raised, so that the cup cleaner 11 is vertically movable with the scatter preventive cup 3. When the scatter preventive cup 3 is lowered, as shown in FIG. 3, the cup cleaner 11 is supported by a torque transmitter 16 in the form of a small disk formed in an intermediate position of the rotary shaft 6. In this state, the cup cleaner 11 is rotatable with the rotary shaft 6 through engagement between a pin 17 formed adjacent the center of the lower surface of the cup cleaner 11 and an engaging bore 18 formed in the torque transmitter 16. The torque transmitter 16, pin 17 and engaging bore 18 correspond to the engaging device of this invention.

The base 7 includes cleaning solution supply nozzles 15 acting as a cleaning solution supplying device for supplying the cleaning solution toward the recess 13 of the cup cleaner 11.

Operation of the spin treating apparatus having the above construction will be described hereinafter.

In a normal substrate spin coating process, as shown in FIG. 1, the cylinders 8 and 9 are extended to raise the scatter preventive cup 3 to the level of the spin chuck 1. The treating solution such as photoresist is supplied from the treating solution supply nozzle 2 to the wafer W which is spun at high speed to spread the treating solution thereon. Part of the treating solution scattering from the wafer W is received and collected by the scatter preventive cup 3. Upon completion of application of the treating solution to the wafer W, the cleaning solution acting as a solvent for the treating solution is sprayed from the back rinse nozzles 31 to the back side surface of spinning wafer W.

During this substrate spin treating process, the cup cleaner 11 is supported by the base 7 and maintained in the raised position along with the scatter preventive cup 3 to lie adjacent the spin chuck 1. At this time, the cup cleaner 11 is disengaged from the torque transmitter 16, and therefore remains still even though the spin chuck 1 is rotated. When the back side surface of wafer W is cleaned, part of the cleaning solution falls and evaporates on the cup cleaner 11. However, the cup cleaner 11 does not undergo a substantial temperature drop since the cup cleaner 11 is formed of a synthetic resin having low heat conductivity and high specific heat. Consequently, a temperature drop of wafer W lying adjacent the cup cleaner 11 is avoided to allow wafer W to be coated uniformly with the treating solution.

For removing treated wafer W and introducing wafer W to be treated, as shown in FIG. 2, only the upper cylinders 8 are contracted to lower the scatter preventive cup 3 by one stage. With only the spin chuck exposed above the cup 3, a transport robot or the like, not shown, is operated to transport wafers W in and out. At this time, the cup cleaner 11 is supported by the base 7 and lowered to an intermediate stage.

In a process of cleaning the scatter preventive cup 3, as shown in FIG. 3, both cylinders 8 and 9 are contracted to lower the scatter preventive cup 3 to a large extent. In the course of descent with the scatter preventive cup 3, the cup cleaner 11 is stopped by the torque transmitter 16 formed on the rotary shaft 6. Only the scatter preventive cup 3 moves downward thereafter. As a result, the cup cleaner 11 is maintained at a height where the cleaning solution guide 12 formed peripherally of the cup cleaner 11 is opposed to a space between the outer cup 3a and baffle disk 3b of the scatter preventive cup 3. In this position, the pin 17 of the cup cleaner 11 extends into the engaging bore 18 of the torque transmitter 16, whereby the cup cleaner 11 is rotatable with the rotary shaft 6.

While the cup cleaner 11 is driven through the rotary shaft 6 to rotate with the spin chuck 1, the cleaning solution is supplied from the cleaning solution supply nozzles 15 to the recess 13 of the cleaning solution guide 12. The cleaning solution supplied to the recess 13 is pushed upward along the annular slant surface 12a and jetted out through the cleaning liquid discharge openings 14 by the centrifugal force of the cup cleaner 11, thereby cleaning inner surfaces of the outer cup 3a and baffle disk 3b. At this time, as shown in FIGS. 5 and 6, the cleaning solution is jetted out of the cleaning solution discharge openings 14 having the upward, horizontal and downward directions, thereby uniformly cleaning the entire outer cup 3a and baffle disk 3b of the scatter preventive cup 3. The cup cleaner 11 may be rotated at high speed to promote the effect of cleaning the outer cup 3a substantially opposed to the cleaning solution guide 12.

Subsequently, the rotating rate of the cup cleaner 11 may be lowered to promote the effect of cleaning the baffle disk 3b disposed below the cleaning solution guide 12.

The cleaning solution guide 12 of the cup cleaner 11 is not limited to the construction described above, but may be modified according to the constructions seen in any one or more of the FIGS. 7A through 13 and described below.

Figure 7A:
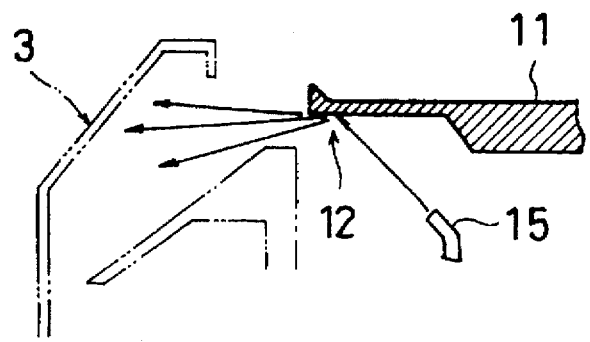
FIGS. 7A, 7B and 7C are fragmentary vertical sections of the cup cleaner, showing modified cleaning solution guides.

(1) As shown in FIG. 7A, a flat lower peripheral surface of the cup cleaner 11 may be used as the cleaning solution guide 12 for directing the cleaning solution from the cleaning solution supply nozzles 15 toward the inner surfaces of the cup.

Figure 7B:
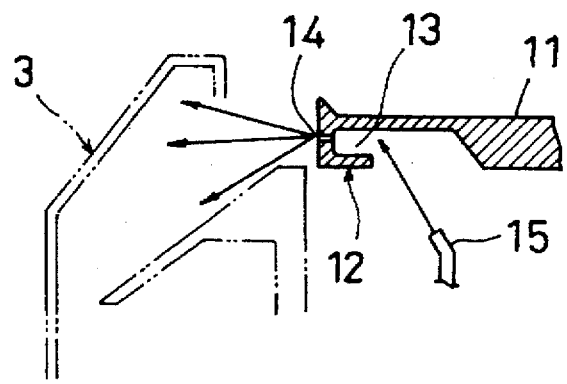

(2) As shown in FIG. 7B, the recess 13 in the cleaning solution guide 12 may be formed flat without liquid sumps.

Figure 7C:
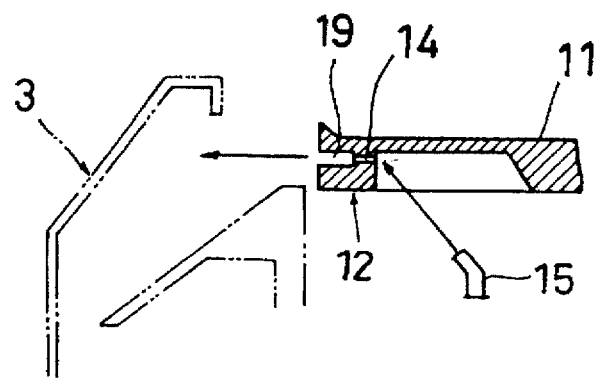

(3) As shown in FIG. 7C, cleaning solution discharge openings 14 may be formed in inner depths of a circumferential groove 19 to provide a directional control of the cleaning solution.

Figure 8A:
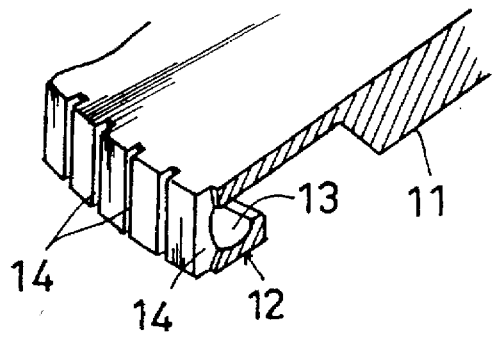
FIGS. 8A and 8B are fragmentary perspectives of the cup cleaner, showing modified cleaning solution discharge openings.
Figure 8B:
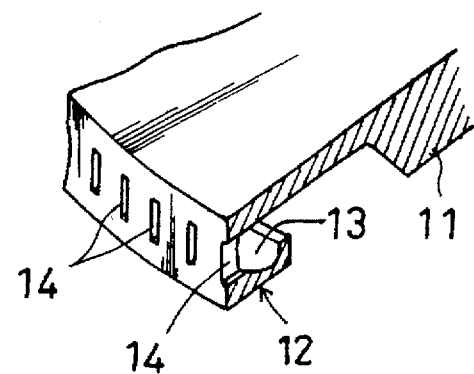

(4) As shown in FIGS. 8A and 8B, the cleaning solution discharge openings 14 may be in the form of vertical slits for discharging the cleaning solution in vertically extended ranges.

Figure 9A:
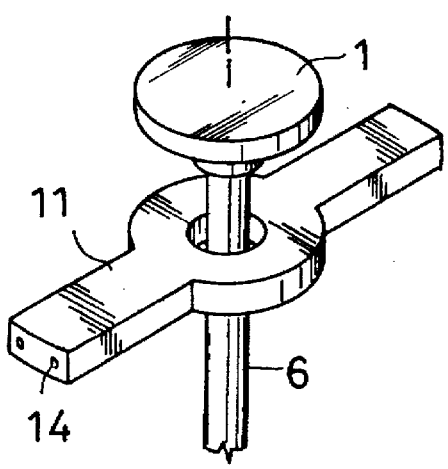
FIGS. 9A, 9B and 9C are perspectives of modified cup cleaners.
Figure 9C:
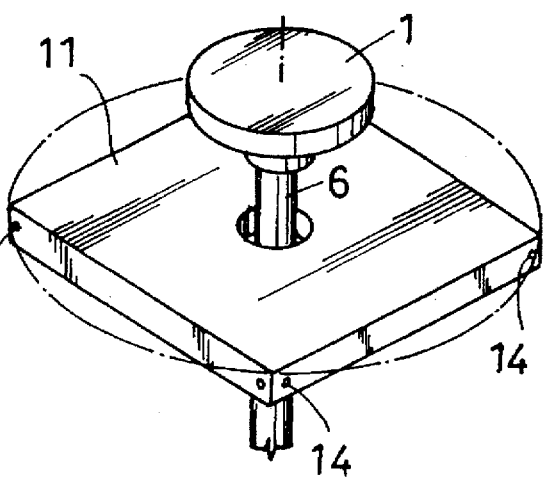
Figure 9B:
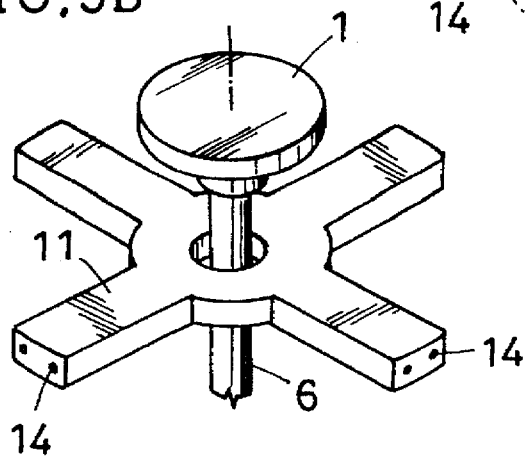

The cup cleaner 11 is not limited to the disk-like shape described in the foregoing embodiment, but may be arm-shaped or in the form of a square board as shown in FIGS. 9A through 9C.

Figure 10:
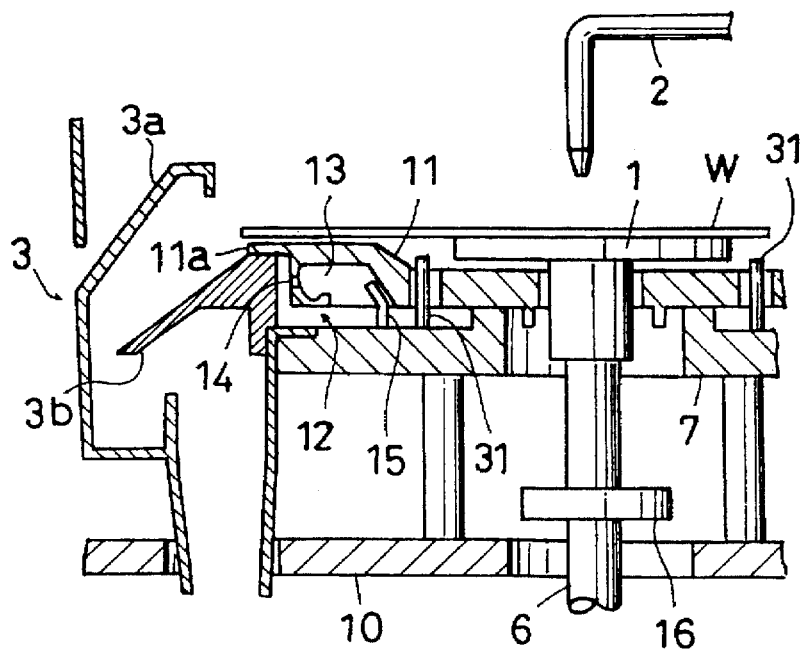
FIG. 10 is a fragmentary vertical section of the apparatus, showing a further modified cup cleaner.

FIG. 10 shows a further modification of the cup cleaner 11. This modified cup cleaner 11 includes a flange 11a extending from a position above the cleaning solution discharge openings 14 toward the scatter preventive cup 3. The flange 11a acts also as an upper portion of the baffle disk 3b. According to this construction, when wafer W is spin-treated as shown in FIG. 10, the cup cleaner 11 is completely fitted in the baffle disk 3b, with the flange 11a integrated with the baffle disk 3b. Consequently, the spin treatment of wafer W is carried out effectively without impairing the of maintaining even distribution of downward below air entering the scatter preventive cup 3.

Figure 11:
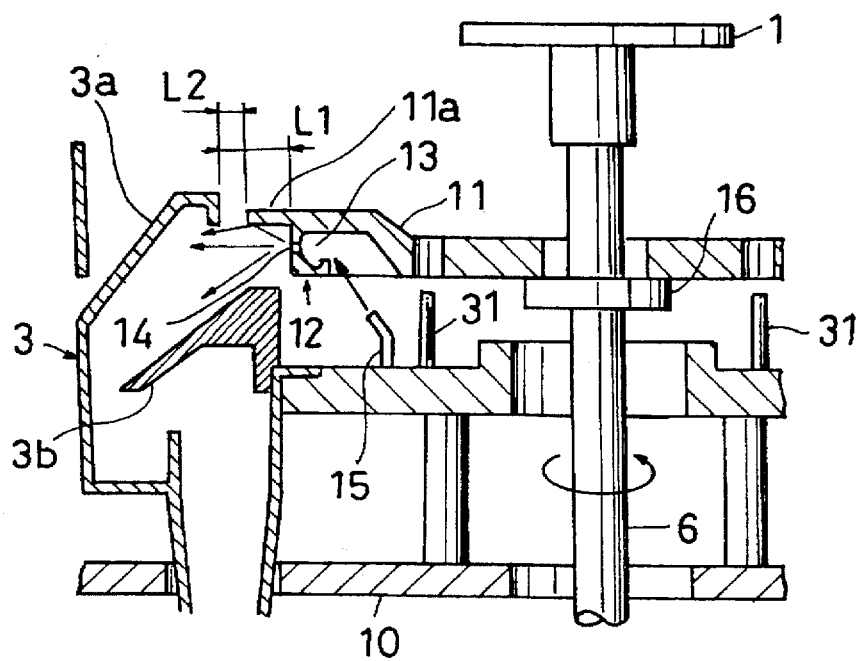
FIG. 11 is a fragmentary vertical section of the apparatus, showing a modified cup cleaning process.
Figure 12:
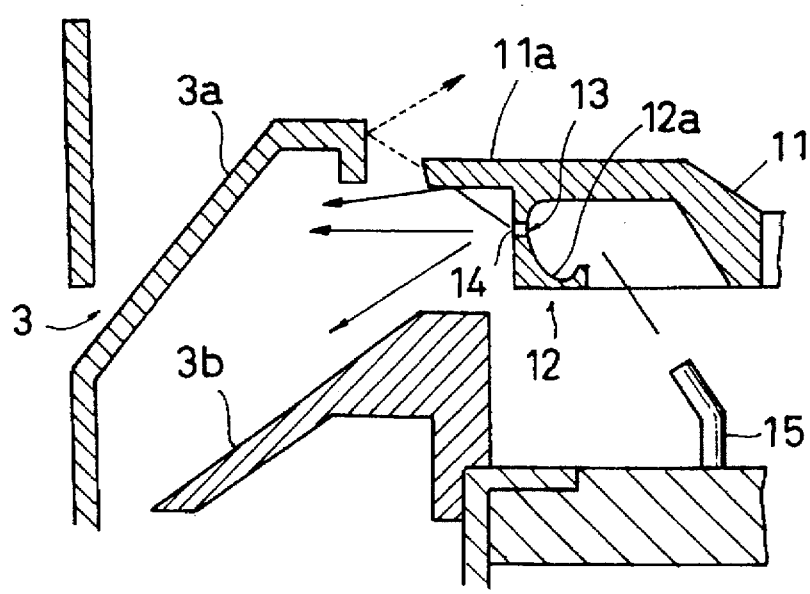
FIG. 12 is an enlarged fragmentary vertical section of the modified cup cleaner.

In the construction shown in FIG. 4, the cleaning solution jetting out in the slightly upward direction from the cleaning solution discharge openings 14 could scatter outside the scatter preventive cup 3 as shown in a dotted line arrow in FIG. 12. The cleaning solution scattering outside the scatter preventive cup 3 may contaminate the spin chuck 1 lying in an upper position at this time. Then, the spin chuck 1 may in turn contaminate wafer W suction-supported by the spin chuck 1. The scattering cleaning solution may contaminate the ambient and equipment also. However, as shown in FIG. 11, the flange 11a formed on the cup cleaner 11 defines a reduced gap L2 with the scatter preventive cup 3 which is smaller than a distance L1 between the cup 3 and the cup cleaner 11 without the flange 11a. Thus, the flange 11a reduces the gap with the scatter preventive cup 3 to suppress leakage of the cleaning solution through the gap and to establish a downward acting guide for the cleaning solution discharged upward from the cleaning solution discharge openings 14. Since an improved directional control is provided for the jets of the cleaning solution, the cleaning solution may be concentrated on desired portions of the scatter preventive cup 3 to realize improved cleaning efficiency. The flange 11a of the cup cleaner 11 need not lie inwardly of edges of wafer W, but may extend outwardly of the wafer edges. That is, the same effect is produced whether an outside diameter of the cup cleaner 11 including the flange 11a is smaller or larger than the diameter of wafer W.

Figure 13:
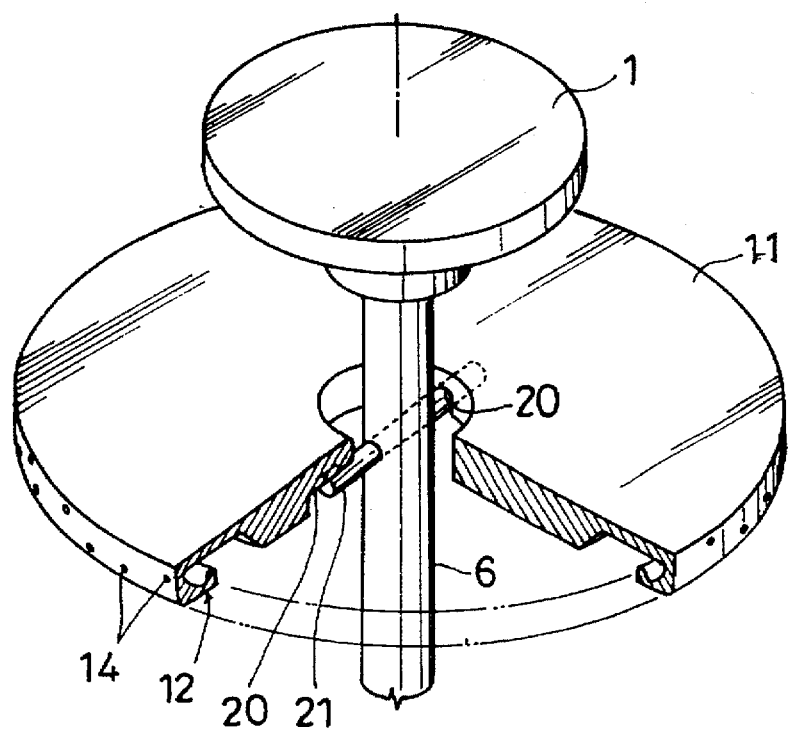
FIG. 13 is a perspective, partly in section, showing a modified connection between a cup cleaner and a rotary shaft.

As shown in FIG. 13, for example, the engaging device for connecting the cup cleaner 11 and rotary shaft 6 may include recesses 20 formed in the lower surface adjacent the center of the cup cleaner 11, and a pin 21 extending through the rotary shaft 6 for engaging the recesses 20.

In the foregoing embodiment, the cup cleaner 11 is lowered to be connected through the torque transmitter 16 to the rotary shaft 6 of the spin chuck 1. Conversely, the rotary shaft 6 may be raised to be connected through the torque transmitter 16 to the cup cleaner 11 for cleaning the scatter preventive cup 3.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate spin treating method for treating a surface of a substrate with a coating solution while spinning the substrate, the coating solution scattering from the spinning substrate being received and collected by a scatter preventive cup, said method comprising:

a spin-treating step for treating said surface of said substrate in a first position established by moving substrate support means and a cup cleaner relative to each other, said substrate support means having a rotary shaft extending through said cup cleaner to be vertically movable relative thereto, said cup cleaner defining a cleaning solution guide for guiding a cleaning solution which acts as a solvent for the coating solution to peripheral positions of said cup cleaner, said rotary shaft and said cup cleaner being disengaged from each other and only said substrate support means being spun in said first position; and a cup cleaning step for cleaning inner surface of said scatter preventive cup in a second position established by vertically moving said substrate support means and said cup cleaner relative to each other, said rotary shaft and said cup cleaner being engaged with each other in said second position, said cleaning solution being supplied to said cup cleaner while spinning said substrate support means and said cup cleaner together, said cleaning solution jetting out of said peripheral positions of said cup cleaner under centrifugal force to clean said inner surfaces of said scatter preventive cup.

2. A substrate spin treating method as defined in claim 1, wherein said first position for said spin-treating step is where said substrate support means and said cup cleaner lie close to each other after a vertical relative movement, and said second position for said cup cleaning step is where said substrate support means and said cup cleaner lie away from each other after a vertical relative movement.

3. A substrate spin treating method as defined in claim 2, further comprising a substrate changing step for transporting substrates to and from said substrate support means in a third position intermediate between said first position and said second position established by vertically moving said substrate support means and said cup cleaner relative to each other.

4. A substrate spin treating apparatus for treating a surface of a substrate with a treating solution while spinning the substrate, comprising:

substrate support means for supporting said substrate;
rotating means for rotating said substrate support means about a vertical axis through a rotary shaft;
treating solution supply means for supplying said treating solution to said substrate;

a scatter preventive cup surrounding said substrate support means for preventing said treating solution from scattering from said substrate when said substrate is spun;

cleaning solution supply means for supplying a cleaning solution;

a cup cleaner fitted on said rotary shaft and defining a cleaning solution guide for guiding said cleaning solution supplied from said cleaning solution supply means to peripheral positions of said cup cleaner;

lift means for vertically moving said cup cleaner and said scatter preventive cup relative to said substrate support means such that, during spin treatment of said substrate, said substrate support means and said cup cleaner lie close to each other, with said scatter preventive cup surrounding said substrate support means, and during cleaning of said scatter preventive cup, said substrate support means and said cup cleaner lie away from each other, with inner surfaces of said scatter preventive cup opposed to said peripheral positions of said cup cleaner; and engaging means for disconnecting said cup cleaner from said rotary shaft when said substrate support means and said cup cleaner lie close to each other, and connecting said cup cleaner to said rotary shaft when said substrate support means and said cup cleaner lie away from each other.

5. A substrate spin treating apparatus as defined in claim 4, wherein said cleaning solution supply means is disposed below said cup cleaner, said cup cleaner being disk-shaped and defining said cleaning solution guide peripherally of a lower surface thereof.

6. A substrate spin treating apparatus as defined in claim 5, wherein said cleaning solution guide includes an annular slant surface inclined upward outwardly of said cup cleaner, and a plurality of cleaning solution discharge openings formed peripherally of said cup cleaner for jetting out said cleaning solution guided by said annular slant surface.

7. A substrate spin treating apparatus as defined in claim 6, wherein said cleaning solution guide further includes an annular recess opening toward a spin center.

8. A substrate spin treating apparatus as defined in claim 6, wherein said cleaning solution discharge openings have varied vertical directions and are distributed circumferentially of said cup cleaner.

9. A substrate spin treating apparatus as defined in claim 4, further comprising back side surface cleaning solution supply means for supplying said cleaning solution toward a back side surface of said substrate, said cup cleaner being formed of a synthetic resin.

10. A substrate spin treating apparatus as defined in claim 5, wherein said cup cleaner includes a flange extending from a position above said cleaning solution guide toward scatter preventive cup.

11. A substrate spin treating apparatus as defined in claim 10, further comprising a baffle disk disposed in a bottom region of said scatter preventive cup to be opposed to a back side surface of said substrate supported by said substrate support means, for distributing gas flows uniformly at the substrate's periphery during substrate treatment, said flange resting on an upper position of said baffle disk during the substrate treatment for distributing the gas flows uniformly in cooperation with said baffle disk.

12. A substrate spin treating apparatus as defined in claim 4, wherein said lift means is operable to vertically move said scatter preventive cup such that, for the spin treatment of said substrate, said scatter preventive cup is raised to an uppermost position, with a base connected to said scatter preventive cup raising said cup cleaner close to said substrate support means, and for the cleaning of said scatter preventive cup, said scatter preventive cup is lowered to a lowermost position, with said cup cleaner received by said engaging means and connected to said rotary shaft.

13. A substrate spin treating apparatus as defined in claim 12, wherein said lift means is operable, when transporting substrates to and from said substrate support means, to move said scatter preventive cup to an intermediate position between said uppermost position and said lowermost position.

14. A substrate spin treating apparatus as defined in claim 13, wherein said lift means comprises a combination of upper and lower air cylinders.

15. A substrate spin treating apparatus as defined in claim 4, wherein said engaging means includes a torque transmitter protruding from said rotary shaft, whereby said cup cleaner moves away from said torque transmitter to be disengaged from said rotary shaft when said cup cleaner is raised along and relative to said rotary shaft, and said cup cleaner operatively engages said torqued transmitter to be drivingly engaged with said rotary shaft when said cup cleaner is lowered along and relative to said rotary shaft.

* * * * *